United States Patent
Ong et al.

[19]

[11] Patent Number: 5,821,772
[45] Date of Patent: Oct. 13, 1998

[54] PROGRAMMABLE ADDRESS DECODER FOR PROGRAMMABLE LOGIC DEVICE

[75] Inventors: Randy T. Ong, Cupertino; Edel M. Young, Palo Alto, both of Calif.

[73] Assignee: Xilinx, Inc., San Jose, Calif.

[21] Appl. No.: 694,650

[22] Filed: Aug. 7, 1996

[51] Int. Cl.$^6$ .......................... H03K 19/173; H03K 7/38
[52] U.S. Cl. ................................. 326/38; 326/40
[58] Field of Search .................. 365/236, 240, 365/189.07, 49; 326/105, 108, 38, 40

[56] References Cited

U.S. PATENT DOCUMENTS

| | | | |
|---|---|---|---|
| Re. 34,363 | 8/1993 | Freeman | 326/38 |
| 4,750,155 | 6/1988 | Hsieh | 365/307 |
| 4,821,233 | 4/1989 | Hsieh | 365/203 |
| 4,831,586 | 5/1989 | Nakagawa et al. | 365/49 |
| 5,208,781 | 5/1993 | Matsushima | 365/236 |
| 5,272,672 | 12/1993 | Ogihara | 365/233 |
| 5,394,031 | 2/1995 | Britton et al. | 326/38 |
| 5,426,379 | 6/1995 | Trimberger | 326/38 |
| 5,485,418 | 1/1996 | Hiraki et al. | 365/49 |
| 5,488,582 | 1/1996 | Camarota | 365/189.05 |
| 5,638,315 | 6/1997 | Braceras et al. | 365/49 |
| 5,670,897 | 9/1997 | Kean | 326/41 |

*Primary Examiner*—Michael J. Tokar
*Assistant Examiner*—Richard Roseen
*Attorney, Agent, or Firm*—Edel M. Young

[57] ABSTRACT

For an FPGA having a configuration memory arranged in rows and columns, a programmable address decoder with a counter selects the order in which columns of memory cells will be programmed and selects which columns of memory cells are programmed. The decoder structure addresses a particular column only when an address provided by the counter matches an address in the memory cells of the decoder for that column. Bitstreams intended for older devices can be successfully loaded into newer devices. Bitstreams developed for future devices with additional features can be loaded into devices with fewer features, and the additional features are not used. The counter can be set to count not in sequential order so that if extra columns are provided, a defective column of the FPGA controlled by a corresponding column of configuration memory cells can be bypassed.

7 Claims, 5 Drawing Sheets

PROGRAMMABLE ADDRESS DECODER FOR PROGRAMMABLE LOGIC DEVICE

FIELD OF THE INVENTION

The invention relates to programmable logic devices formed as integrated circuits and to the structure for programming the logic devices. The invention particularly relates to reprogrammable logic devices and to field programmable gate arrays (FPGAs).

BACKGROUND OF THE INVENTION

The first FPGA with programmable logic cells and programmable routing was described by Freeman in U.S. Pat. No. 4,870,302 reissued as Re 34,363, incorporated herein by reference. The FPGA includes configurable logic blocks and configurable routing. In reprogrammable logic devices, both the logic blocks and the routing are configured or programmed by memory cells. The configuration memory cells are typically arranged in an array and are loaded with a bitstream of configuration data to cause the FPGA to perform a desired function.

FIG. 1 shows a prior art configuration memory such as used by Xilinx, Inc., assignee of the present invention. The memory of FIG. 1 is a 16-bit by 16-bit array, or 256 memory cells. A typical array of configuration memory cells in a commercial device is on the order of 20,000 to one million memory cells. Thus, the array of FIG. 1 is much smaller than used in a commercial embodiment, but nevertheless shows the structure of prior art configuration memories. To load the configuration memory, under control of a clocking mechanism, the bitstream of configuration data is shifted through data shift register DSR until a frame of data has been shifted into bit positions DS0 through DS15. This frame of data is then shifted in parallel on lines D0 through D15 into a column of cells addressed by address shift register ASR. Typically, some memory cells are missing from the rows and columns. Dummy bits are inserted into the bitstream as place holders for these missing memory cells. The column is addressed by shifting a token high bit through the address shift register ASR from bit AS0 to bit AS15, one shift per frame. Each time a frame of configuration data is loaded through shift register DSR, it is shifted in parallel to the column of memory cells selected by the token high bit. When the token high bit shifts out to the right, it activates a DONE circuit, which indicates that configuration is complete and causes the FPGA to become operational.

A configuration memory cell consists of a latch formed from inverters connected into a loop, with a connection to a data line addressed by an address line for writing to the memory cell, and a line extending from a node within the memory cell to a portion of the FPGA logic block or routing structure to control a transistor or provide a stored value. A memory cell may comprise a five-transistor latch such as M0-0 shown in FIG. 1a having one access transistor T1 and two CMOS inverters I1 and I2 connected into a loop as shown. (As is well known in the CMOS design art, the two inverters of FIG. 1a each comprise one PMOS transistor and one NMOS transistor connected in series between power and ground with the input applied at the gates and the output taken from a node between the two transistors.) The latch is connected to data line D0 by transistor T1 which is controlled by address line A0. A line Q or $\overline{Q}$ (or both) extends from memory cell M0-0 to the FPGA logic structure (not shown) to control configuration. Such a structure is described by Hsieh in U.S. Pat. Nos. 4,750,155 and 4,821,233 [M-231, M-231-1], which are incorporated herein by reference.

A purchaser of an FPGA may spend days, weeks, or months developing and perfecting a logic design to be implemented by the FPGA and generating the accompanying bitstream to actually program the FPGA. Companies such as Xilinx, Inc., which make FPGAs and other programmable devices continue to develop new device architectures (or device families) with new features. Yet they continue to sell older families of devices because customers continue to order these older device families rather than repeat the engineering required to generate a different bitstream to cause a newer device to produce the same desired function. This means that the company must maintain an inventory of an increasing number of device families and maintain the manufacturing capacity to manufacture many device families. It is desirable to make the older device families obsolete and thus minimize the number of device families in inventory without inconveniencing any customers. It is also desirable to minimize the number of device families being manufactured in order to optimize the manufacturing capacity.

SUMMARY OF THE INVENTION

The present invention allows bitstreams intended for older devices to be successfully loaded into newer devices, and allows bitstreams developed for future devices with additional features to be loaded into devices with fewer feature.

According to the invention, for an FPGA having a configuration memory arranged in rows and columns, a programmable address decoder with a counter selects the order in which columns of memory cells will be programmed and selects which columns of memory cells are programmed. The decoder structure addresses a particular column only when an address provided by the counter matches an address in the memory cells of the decoder for that column.

DETAILED DESCRIPTION OF SOME EMBODIMENTS OF THE INVENTION

Figure 2:
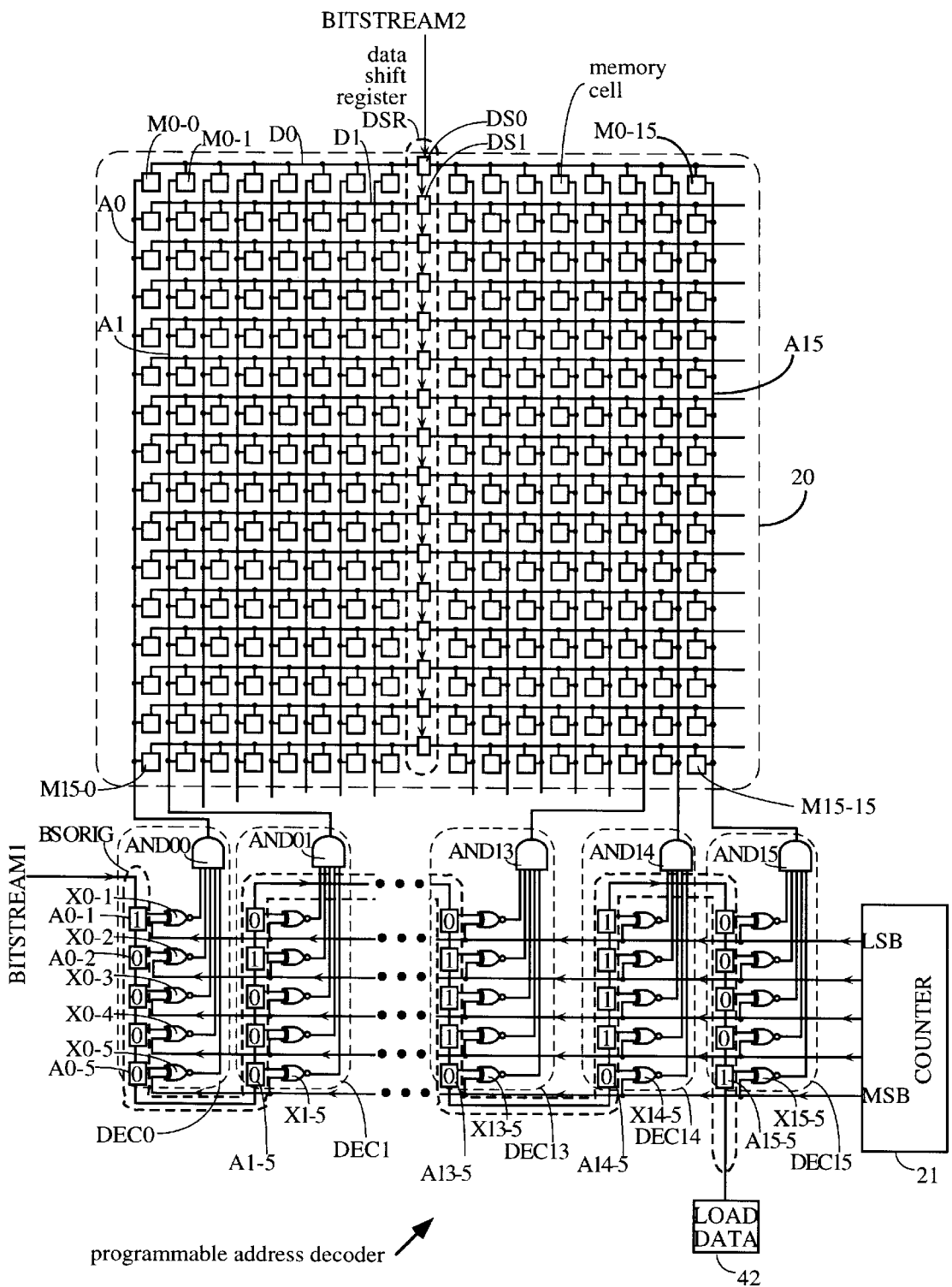
FIG. 2 shows a configuration memory array and programmable address decoder in a first embodiment of the present invention.

FIG. 2 shows a configuration memory 20 and a programmable address decoder according to the invention. The programmable address decoder includes a shift register BSORIG, address decoder DEC0 through DEC15, one for each column of configuration memory 20, and a counter 21. A configuration bitstream for configuring the FPGA begins with an address portion, which is applied at the terminal BITSTREAM1, for programming the address decoder, and continues to be applied at BITSTREAM1 until a code at the beginning of the bitstream reaches a load data circuit 42, which causes the bitstream to be applied to the configuration data terminal BITSTREAM2. A set of bits applied at BITSTREAM1 give addresses of columns to be loaded by the configuration data shifted in at BITSTREAM2. Counter 21 is designed so that it never provides the count 00000. A column is addressed when a count provided by counter 21 matches the value shifted into a decoder through BITSTREAM1.

Figure 1:
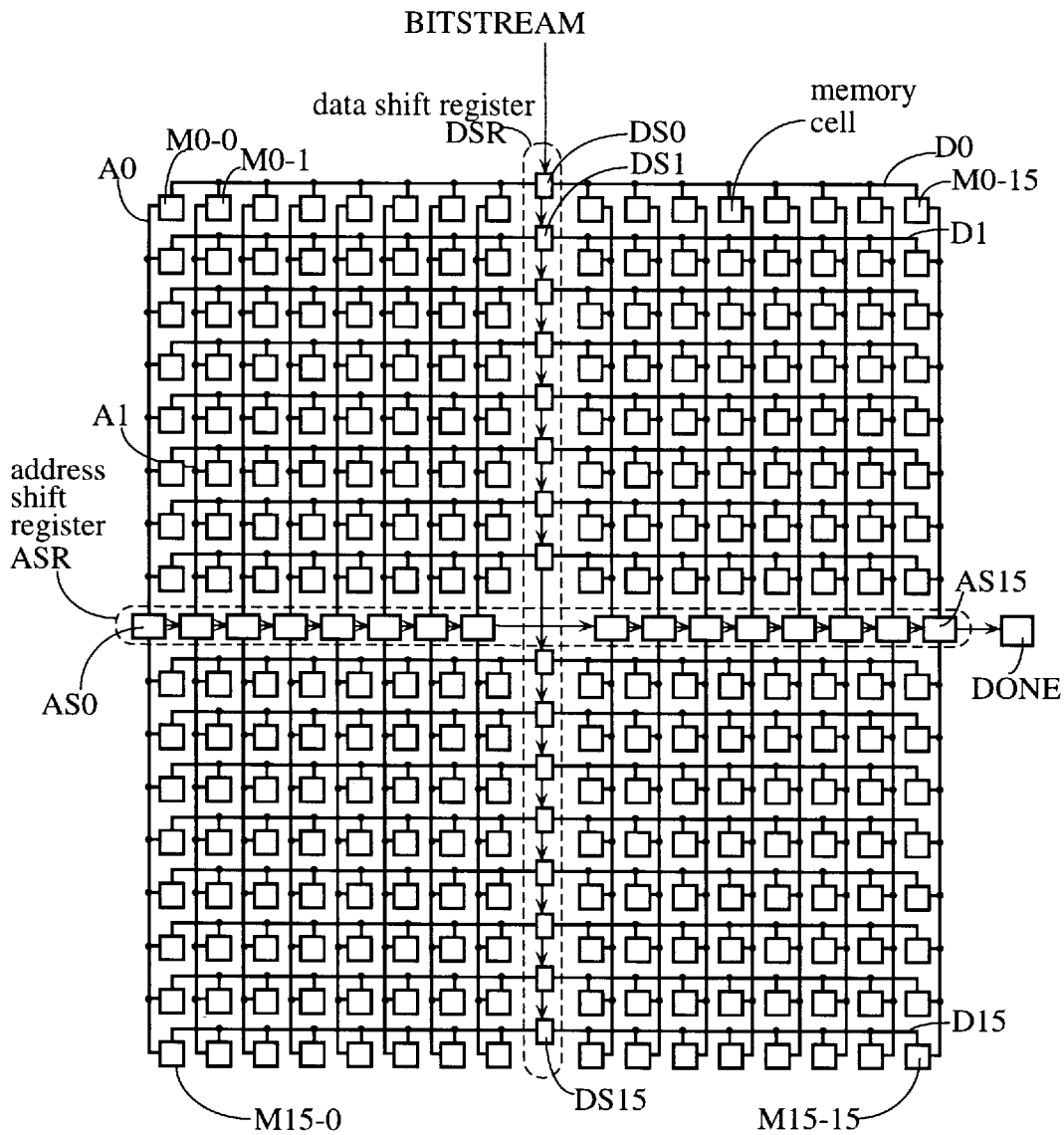
FIG. 1 shows a prior art configuration memory array with prior art address shift register.
Figure 1A:
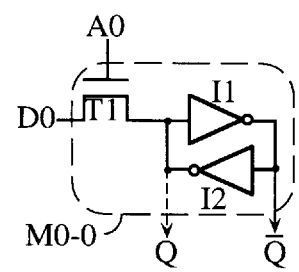
FIG. 1a shows a prior art memory cell structure usable in the memory cells of FIG. 1.

For example, decoder DEC0 includes XNOR gates X0-1 through X0-5, AND gate AND00, and address memory cells A0-1 through A0-5. The address 00001 has been shifted into address memory cells A0-5 through A0-1. When and only when counter 21 provides the count 00001, XNOR gates X0-5 through X0-1 all provide high output signals. These output signals are received by AND gate AND00, and when all are high, AND gate AND00 provides a high output signal on address line A0. As can be understood from looking at FIG. 1a, a high address signal causes data to be written into the memory cell. A high address signal on address line A0 causes configuration data shifted in to data shift register DSR at BITSTREAM2 to be loaded into memory cells M0-0 through M15-0.

In FIG. 2, the bits shifted into BITSTREAM1 cause data to be loaded starting with address line A0, then address line A1, and so on until address line A15. Another pattern of bits shifted into BITSTREAM1 would cause data to be loaded in a different order. Sometimes during testing it may be desirable to load the same test pattern into groups of columns of the configuration memory. This can be easily accomplished by loading the same address into a group of decoders. Then the configuration data portion loaded at BITSTREAM2 will be shortened by the number of column groups that will receive the same configuration data. The structure of FIG. 2 thus offers another degree of freedom in loading configuration data compared to that of prior art FIG. 1.

Figure 3:
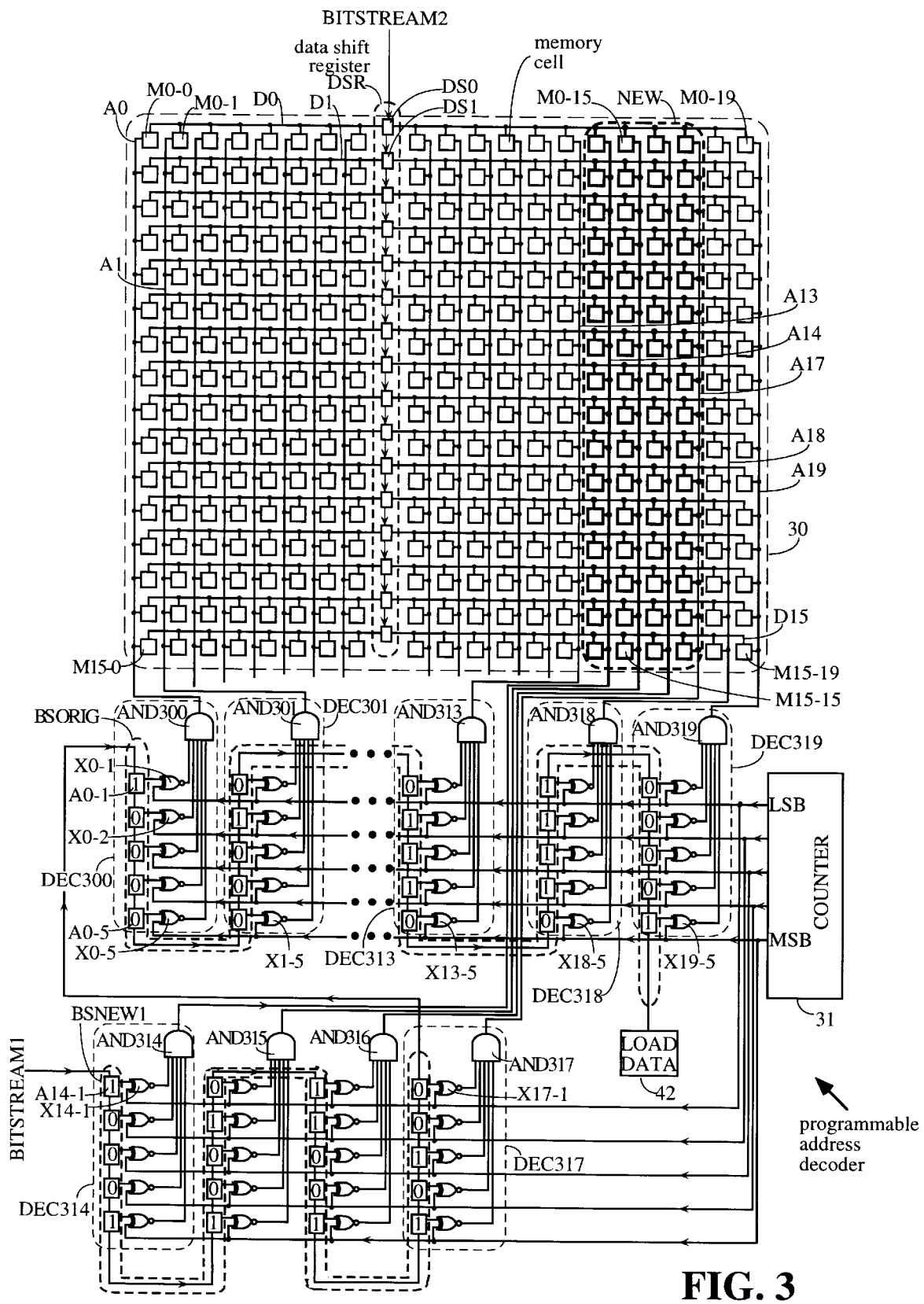
FIG. 3 shows a configuration memory array and programmable address decoder in a second embodiment of the present invention which is bitstream compatible with FIG. 2 after modification of the bitstream.

FIG. 3 shows a device that is configuration bitstream compatible with the structure of FIG. 2 except for length, and includes additional features not available in the structure of FIG. 2. In FIG. 3, a group NEW of memory cells M0-14–M15-14 through M0-17–M15-17 control features not available in the device controlled by FIG. 2. Memory cells M0-18 through M15-18 and M0-19 through M15-19 control the same features as the rightmost two columns in FIG. 2. In FIG. 3, the configuration memory cells for controlling the new features are loaded under control of address decoders DEC314 through DEC317. The address bitstream is loaded first, at terminal BITSTREAM1, and is shifted until a code is detected by load data circuit 42, as in FIG. 2. After the address bitstream is loaded, configuration bitstream data are then loaded at terminal BITSTREAM2 and placed into columns according to the addresses specified in the address bitstream portion. The address bitstream in FIG. 3 first passes through decoders DEC314 through DEC317 before passing through decoders DEC300 through DEC313 and then DEC318 and DEC319. The address bitstream portion BSORIG is the same as in FIG. 2 and thus identifies columns corresponding to the original features. Columns 0–13, 18, and 19 control original features and are thus identified by the original bitstream to be loaded with configuration bitstream data in the same order as FIG. 2. New features are controlled by configuration information in the new configuration memory cells, which are loaded in response to addresses loaded into the BSNEW portion of the address bitstream. This embodiment requires that an old bitstream (address plus configuration bits) be converted: a string of 0's must be inserted at the end of the address portion of the bitstream used with FIG. 2 so that in FIG. 3 these 0's will be loaded into BSNEW before configuration data start being loaded at terminal BITSTREAM2 of FIG. 3. When an old bitstream is used with a new part, and the decoders DEC314 through DEC317 are loaded with all 0's, the NEW configuration memory cells will never be addressed, and thus the FPGA features controlled by these configuration memory cells will not be used. The FPGA controlled by FIG. 3 will thus perform as did the FPGA controlled by FIG. 2, and from the viewpoint of the user of the device, the FPGAs controlled by FIGS. 2 and 3 will be identical.

When a user develops a new design using both old and new features available in the FPGA controlled by FIG. 3, the address bitstream will include addresses such as shown in FIG. 3 for BSNEW. After BSORIG and BSNEW are loaded, the LOAD DATA circuit 42 is activated and configuration data begins to be loaded. The example shown in FIG. 3 takes advantage of both old and new features. The pattern of addresses loaded into decoders DEC300 through DEC319 causes address lines A0 through A13 to be addressed in order, then address lines A18 and A19 to be addressed, then address lines A14 through A17 to be addressed, assuming counter 31 counts up sequentially from 00001 (not from 00000). By reconverting the bitstream to delete the portion BSNEW, a design intended for an FPGA controlled by FIG. 3 can be used with an FPGA controlled by FIG. 2, and the new features available only in the FIG. 3 FPGA will simply not be available.

Figure 4:
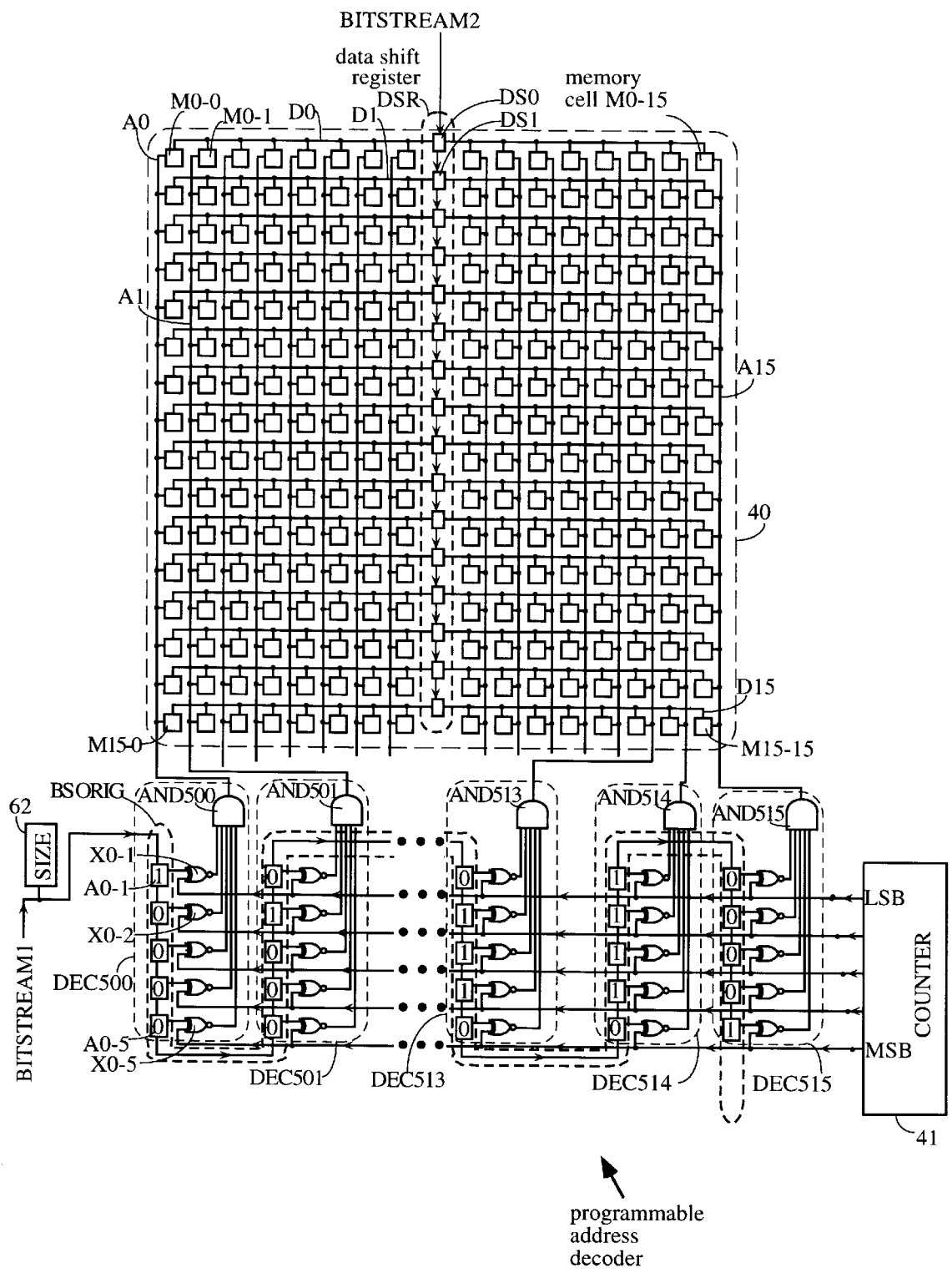
FIG. 4 shows a configuration memory array and programmable address decoder in a third embodiment of the present invention. This embodiment includes a size register for storing bitstream size.
Figure 5:
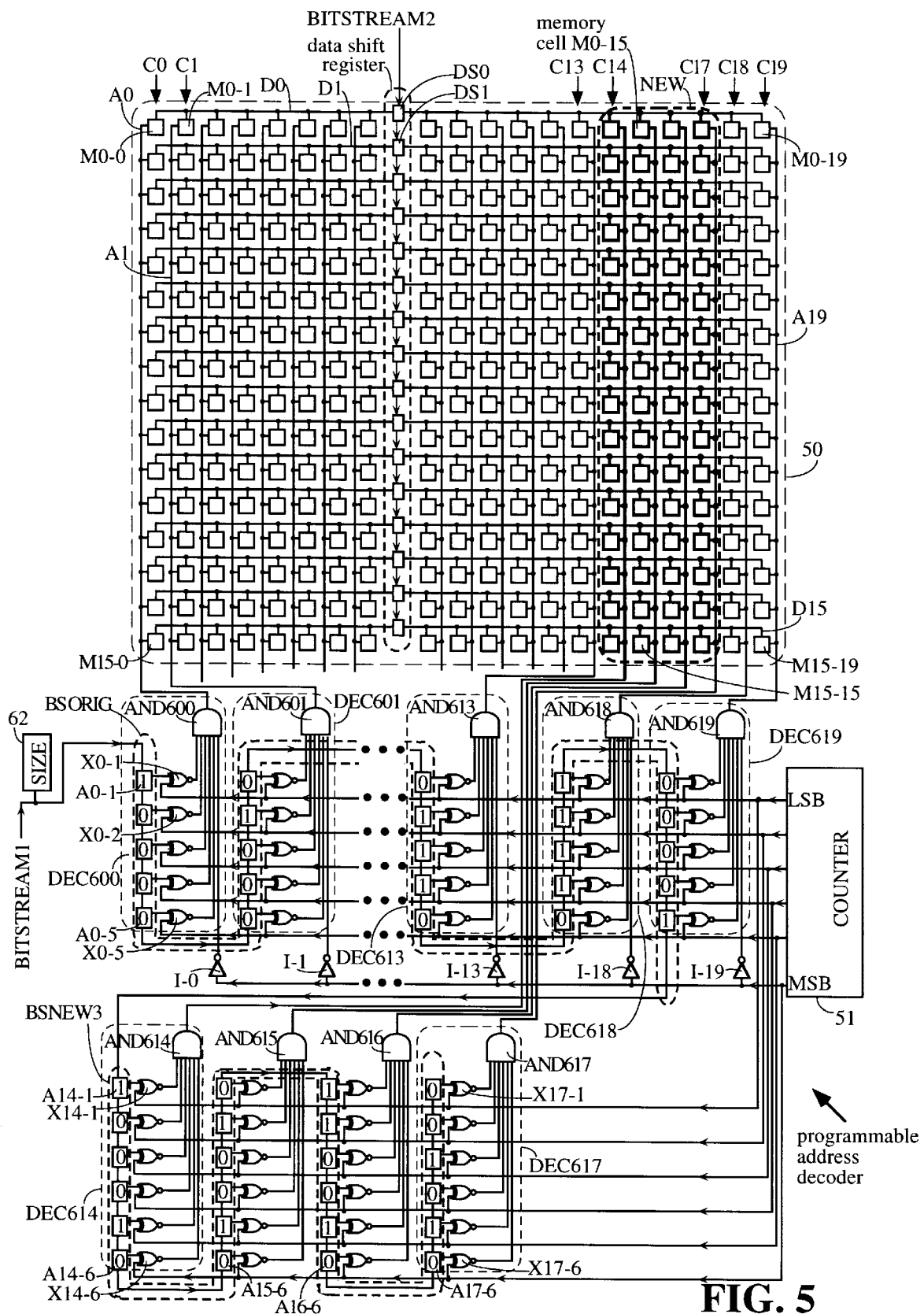
FIG. 5 shows a larger configuration memory and an address decoder that is compatible with the device of FIG. 4 without modification of the bitstream.

FIGS. 4 and 5 illustrate another embodiment of the invention in which devices of a family having different size configuration memories and different features can receive the same bitstreams and no adjustment need be made. In FIGS. 4 and 5, the bitstream is headed by a size indicator which tells the length of the address bitstream, and may also tell the frame size of the configuration data bitstream. The entire structure is cleared to 0 before any configuration information is loaded, thus all memory locations initially are at logic 0. In FIG. 4, the size indicator is loaded first, into size register 62, followed by the address bitstream BSORIG, followed by the configuration data loaded at BITSTREAM2 into configuration memory 40. The size register controls the number of clock cycles during which the address bitstream BSORIG is loaded into address decoders. In the example of FIG. 4, the address bitstream contains 80 bits, which are loaded into decoders DEC500 through DEC515. When this address bitstream is in place, size register 62 causes the bitstream to continue loading at BITSTREAM2 into data shift register DSR. If size register 62 includes a frame length indicator, size register 62 causes a number of bits equal to the frame length to be loaded into data shift register DSR. For example, size register 62 may include a down counter which receives the frame size and counts down from that count, then upon reaching 0 causes data to shift from data shift register DSR into an addressed column of configuration memory cells, the column being determined by the decoder whose address matches the count provided by counter 41.

FIG. 5 represents a device with old features controlled by columns C0 through C13, C18, and C19, and new features controlled by columns C14 through C17. When columns C14 through C17 carry logical 0, the new features are not enabled. As in earlier embodiments, counter 51 never generates the address 000000. When a bitstream intended for the FPGA controlled by FIG. 4 is loaded into the FPGA of FIG. 5, its size indicator indicates that the size is that of the smaller part. Only BSORIG is then loaded. Thus address decoders DEC614 through DEC617 continue to carry address 000000, which is never accessed by counter 51. Thus columns enabled by these decoders are not loaded. The original features present in FIG. 4 are thus accessed by the bitstream loaded into FIG. 5. In this embodiment it is possible for a user to remove from a socket a device such as that controlled by the FIG. 4 structure and place into the socket a device controlled by the FIG. 5 structure. Even if new features are not used, a user may see a speed increase if speed is an improvement available in the new device. But the function of the old device will be repeated in the new device.

Conversely, if a bitstream developed for a device such as FIG. 5 is to be used in a device such as FIG. 4 (having a smaller address bitstream capacity), the size information loaded into the SIZE register 62 of FIG. 4 indicates that the address bitstream is larger than the available capacity. But this does not prevent the bitstream from being used in the device. The address bitstream is shifted through BSORIG and out (into nothingness) until the last portion of the address bitstream ends up in the section BSORIG. Configuration data are then loaded into the configuration memory as determined by BSORIG. Configuration data bits for controlling any new features are discarded because when they are loaded into the shift register DSR, no column is addressed. However, configuration data bits for original features will enable the original features, and that portion of the functionality will be available to the user.

FIG. 5 shows another expansion feature that allows bitstream compatibility and allows for significant expansion when new features are added. The structure of FIG. 5 uses a larger counter 51 than counter 41 of FIG. 4. In the particular example, counter 51 adds only one digit and can therefore count twice as high as counter 41. However the principle of using a larger counter applies for an increase of multiple digits.

Column C0 is addressed by six-input AND gate AND600. Five of the inputs to AND gate AND600 come from XNOR gates X0-1 through X0-5 as in FIG. 4. The sixth input comes from inverter I-51. The input of inverter I-51 is the most significant bit MSB of counter 51. Thus address line A0 can only be addressed when counter 51 is in the lower part of its count and its MSB is 0. New features available in the FPGA controlled by FIG. 5 can be addressed as in FIG. 4 by addresses provided in BSNEW3. In the example of FIG. 5, decoders DEC614 through DEC617 all have logic 0 in their most significant bits, in memory cells A14-6, A15-6, A16-6, and A17-6. Thus these decoders will cause their respective columns in the configuration memory 50 to be loaded when counter 51 is the lower portion of its count.

However, a much larger addition to the original configuration memory will result in a much larger corresponding new address bitstream, and some of the addresses will carry a logic 1 in their most significant bit. Much larger devices may have bitstreams in which the new features are controlled by configuration bits which in turn are addressed by a counter having several additional digits. All address decoders of these new features are loaded with logic 1 in that digit which distinguishes from the smaller bitstream for the smaller older device. Thus the embodiment of FIG. 5 illustrates a structure in which very large expansion of a bitstream for accommodating new features is possible, yet the bitstream for a smaller older device can be loaded into the new larger device to perform the same function performed by the smaller older device.

In light of the above disclosure, other embodiments of the invention will become obvious to those skilled in the art. Such other embodiments are intended to fall within the scope of the attached claims. For example, the XNOR gates can be replaced by XOR gates and an up counter replaced by a down counter, or the AND gates can be replaced by other combinatorial gates with corresponding changes to other elements to achieve the equivalent result.

We claim:

1. For an FPGA having a configuration memory comprising configuration memory cells arranged in rows and columns, a programmable address decoder for addressing a column of said configuration memory cells comprising:

a plurality of address memory cells for receiving an address bitstream;

a counter;

a decoder structure that addresses said column only when an address provided by said counter matches an address in said plurality of address memory cells.

2. A programmable address decoder as in claim 1 in which said plurality of address memory cells are connected into a shift register and loaded from a bitstream.

3. A programmable address decoder as in claim 2 wherein said FPGA is a second generation FPGA and said shift register comprises a first portion for holding an original address bit stream associated with features also present in a first generation FPGA and a second portion for holding a new address bit stream associated with features not present in said first generation FPGA, wherein corresponding features in said first and second generation FPGAs are configured to perform identical functions in response to identical first portions.

4. A programmable address decoder as in claim 1 wherein said plurality of address memory cells are grouped into a plurality of sets, one set of address memory cells associated with each column of said configuration memory to be addressed, and each address memory cell of one set corresponding to one output line from said counter.

5. A programmable address decoder as in claim 4 further comprising one set of XNOR gates corresponding to each set of address memory cells, and for each set, one XNOR gate receiving an output signal from a corresponding address memory cell and an output signal from said counter, and all XNOR gates in said set providing inputs to an AND gate for addressing a corresponding column of said configuration memory cells.

6. A programmable address decoder as in claim 4 wherein said counter includes at least one output line not associated with any memory cell of at least one of said sets.

7. A structure for configuring an FPGA from a bitstream of, comprising:

a memory array divided into frames, each such frame having an address;

a data shift register capable of storing one frame of data;

a counter; and a plurality of programmable address decoders, one such decoder being provided for each frame, each such decoder comparing the address of the associated frame to the value in said counter, wherein one of said programmable address decoders loads a frame of data from said data shift register into a selected frame when said programmable address decoder associated with the selected frame indicates that the value in said counter matches the address of the selected frame, and wherein the address value programmed into said address decoder is derived from the bitstream.

* * * * *